(12) United States Patent
Ibok et al.

(10) Patent No.: US 6,225,170 B1
(45) Date of Patent: May 1, 2001

(54) SELF-ALIGNED DAMASCENE GATE WITH CONTACT FORMATION

(75) Inventors: Effiong Ibok, Sunnyvale; Richard P. Rouse, San Francisco, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/428,481

(22) Filed: Oct. 28, 1999

(51) Int. Cl.[7] .................. H01L 21/336; H01L 21/3205
(52) U.S. Cl. .................. 438/291; 438/286; 438/585; 438/592
(58) Field of Search .................................. 438/585

(56) References Cited

U.S. PATENT DOCUMENTS

| | | | |
|---|---|---|---|
| 3,386,016 | * | 5/1968 | Lindmayer . |
| 6,090,676 | * | 7/2000 | Gardner et al. ............ 438/303 |
| 6,093,628 | * | 7/2000 | Lim et al. .................. 438/592 |
| 6,100,142 | * | 8/2000 | Liao ........................... 438/291 |

* cited by examiner

*Primary Examiner*—John F. Niebling
*Assistant Examiner*—Olivia Luk

(57) ABSTRACT

In order to form a self-aligned damascene gate with an attendant contact or contacts, a thick layer of dielectric material is formed over a semiconductor substrate in which drain and source regions have previously been implanted and annealed. This dielectric layer is polished for planarity, a combined gate and contact mask is used to pattern the dielectric, and the interlayer dielectric is etched and the resist is stripped. The gate dielectric is deposited and polysilicon is then deposited over the dielectric and doped by implantation and then annealed. This polysilicon layer is polished to the dielectric level. The wafer is then masked to cover the gate and the polysilicon is anisotropically etched off in the contact areas. The exposed polysilicon at the gate site and the silicon exposed at the contact site are then salicided.

7 Claims, 4 Drawing Sheets

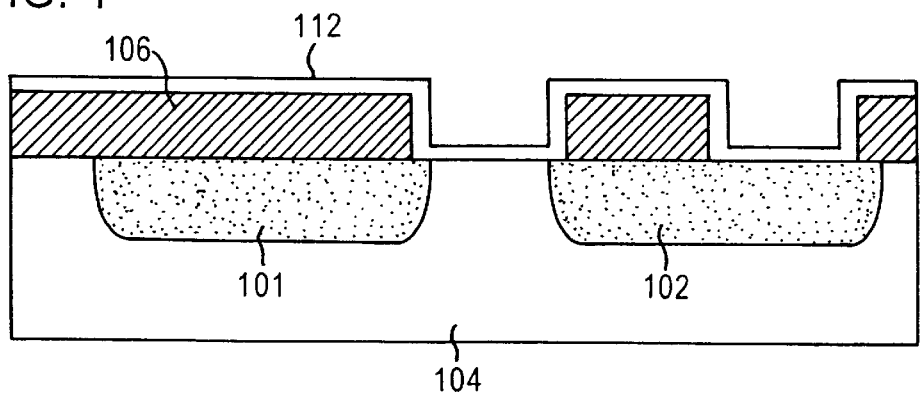
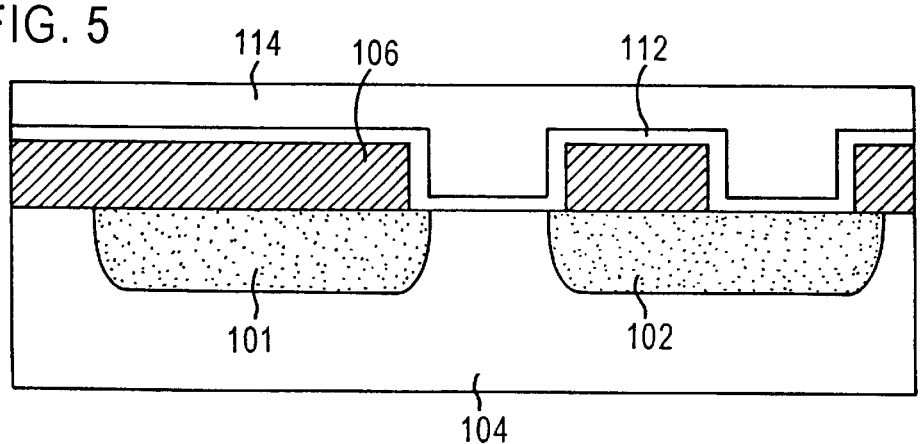
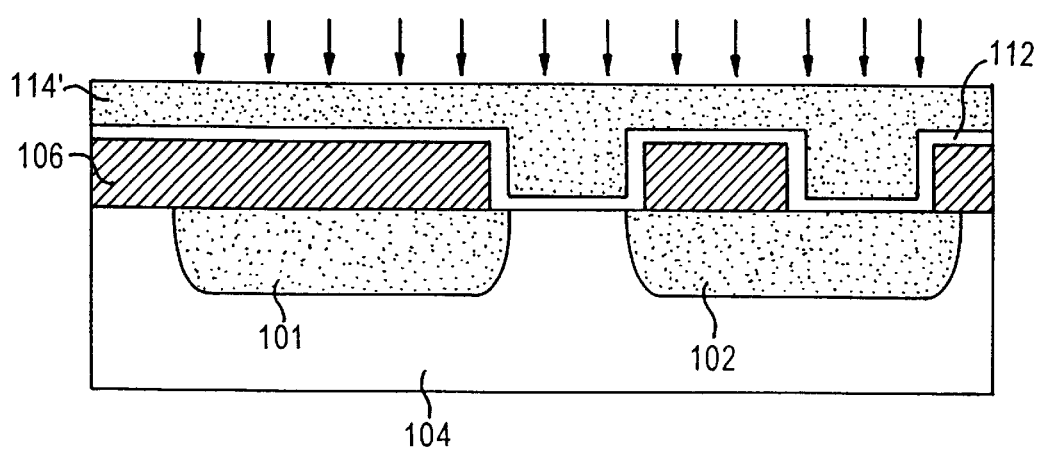

SELF-ALIGNED DAMASCENE GATE WITH CONTACT FORMATION

BACKGROUND OF THE INVENTION

1. Field of the Invention

The present invention relates generally to gate formation and more specifically to a method of forming a self-aligned damascene gate with an attendant contact or contacts.

2. Description of the Related Art

Fabrication of an integrated circuit involves numerous processing steps. After impurity regions have been deposited within a semiconductor substrate and gate areas defined upon the substrate, interconnect routing is formed on the semiconductor topography and connected to contact areas to form an integrated circuit. The entire process of making an ohmic contact to the contact areas and routing interconnect material between ohmic contacts is described generically as "metalization". This process, as is well known can involve electrically conductive materials other than metals per se. Nevertheless, as the complexity of integrated circuits has increased, the complexity of the metalization composition has also increased.

In such circuits, a junction is generally configured near a gate conductor within a substrate. Earlier contact structures involved depositing an interlevel dielectric over the junctions and gate conductors, and then etching an opening or window through the interlevel dielectric directly above the junctions to which contact is to be made. This etching, however, involved numerous problems. For example, the contact window opening required an additional masking step. Unfortunately, the mask is often times misaligned with the junction, resulting in an increase in junction capacitance. Additionally, opening a window of minimum size through a relatively thick interlevel dielectric is, by its nature, problematic. In order to achieve a relatively anisotropic etch, a plasma etch is required, leaving deleterious amounts of etch byproducts (e.g., polymers) at the base of the opening. Still further, difficulties arise whenever the interconnect material must extend over the interlevel dielectric and into the relatively small opening through the interlevel dielectric. Most conventional interconnect materials, such as aluminum, were unable to fill the openings without "cusping", or without encountering step coverage at the juncture between the window and the interlevel dielectric surface.

More modem contact structures make use of contacts which are self-aligned with the junctions. More specifically, those contacts are referred to as self-aligned silicides, or so called "salicides". A salicide process involves depositing a metal across the semiconductor topography, and then reacting the metal only in regions where silicon molecules are present. As a result of this reaction step, silicides form only at the upper surfaces of the junctions and the upper surfaces of the polysilicon gate conductors. A region between the junctions and the gate conductor upper surfaces is often provided with a sidewall spacer generally formed from silicon dioxide (oxide).

An interlevel dielectric is formed after the suicides are self-aligned to the silicon-bearing underlayers. This interlevel dielectric undergoes a patterned etch over the regions to which contact must be made. However, the pattern etch placement is not deemed as crucial as the etch needed to form a contact window in pre-salicide processes.

More specifically, the etch to the underlying salicide need only contact a portion of the salicide and need not be carefully bounded to the entire perimeter of the salicide. Another advantage to using a salicide, beyond its self-aligned properties, is the retained purity of the silicon-based material prior to silicide growth.

Silicide is grown upon and into the junctions without necessarily having to pre-clean those surfaces of interlevel dielectric etch byproducts commonly encountered in pre-salicide techniques.

Nevertheless, the techniques which are currently employed in prevailing art gate dielectric formations, gate deposition and patterning and contact formation are carried out sequentially. Accordingly, at high densities gate profile, contact misalignment and salicide bridging are all causes of performance and yield degradation.

SUMMARY OF THE INVENTION

The present invention is based on a method of forming a self-aligned damascene gate with an attendant contact or contacts which attenuates the above-mentioned problems through the use of a uniquely different fabrication process.

One embodiment of the present invention is such as to cover doped source and drain regions with a thick layer of a dielectric material, and then pattern and etch openings through the thick dielectric layer at locations which are selected with respect to the source and drain regions to be appropriate for gate and contact formation. Once the openings are formed, a layer of oxide (i.e. a Gox—gate oxide) is formed which covers the upper surface of the dielectric layer along with the side walls and the exposed substrate exposed at the bottom of the openings. Upon completion of this layer, a layer of polysilicon is formed over the oxide layer. This polysilicon layer is then doped and subjected to chemical-mechanical polishing (CMP) or the like to remove the polysilicon and oxide layers down to the level of the dielectric layer.

The site which is to become the gate is then masked. The exposed polysilicon and the oxide layer in the second opening are subsequently removed via suitable etching to expose the silicon of the semiconductor substrate. The mask is then removed and the exposed polysilicon and silicon surfaces are treated to form silicides.

The contact can then be filled and treated using CMP. Alternatively, the dielectric layer can be stripped off and the redeposited in a manner which permits contact formation in accordance with known techniques.

More specifically, a first aspect of the invention resides in a method of forming a semiconductor device having a gate and at least one contact, the method comprising the steps of: forming a thick dielectric layer over a semiconductor substrate in which a source region and a drain region are previously formed, said dielectric layer having a thickness of about 2000 Å to about 8000 Å; forming first and second openings in the dielectric layer at first and second sites which are respectively located with respect to the source and drain regions so that the first opening exposes part of both of the source region and the drain region and therefore is suited to the formation of a gate structure, and the second opening is located so as to expose only part of one of the source and drain regions; forming an oxide layer over the dielectric layer and over a side wall surface and a bottom of the first and second openings; forming a polysilicon layer over the oxide layer; doping the polysilicon layer; selectively removing portions of the polysilicon layer and the oxide layer until the dielectric layer is uncovered; masking the first site and removing the polysilicon and the oxide layers from the second opening to expose the semiconductor substrate at the bottom of the second opening; and then removing the mask and reacting the exposed portions of the polysilicon which remains in the first opening and the silicon at the bottom of the second opening to form first and second silicide layers.

BRIEF DESCRIPTION OF THE DRAWINGS

The various features and advantages of the present invention will become more clearly appreciated as a detailed description of the preferred embodiments of the invention is given with reference to the appended drawings in which:

FIG. 4 shows the formation of an oxide, nitride or ONO layer over the surface of the dielectric layer and surfaces of the openings;

FIG. 5 shows a layer of polysilicon formed over the oxide layer;

FIG. 6 shows the polysilicon layer being doped via ion implantation or the like type of process;

DETAILED DESCRIPTION OF THE PREFERRED EMBODIMENT

Figure 1:
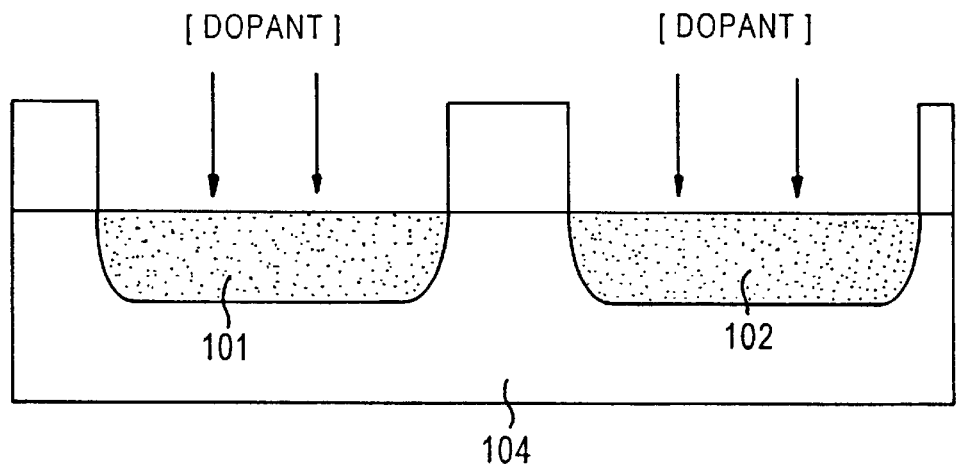
FIG. 1 shows a substrate being doped using a conventional implantation technique in preparation for the formation of source and drain regions.

FIGS. 1–9 show a process for forming a self-aligned damascene gate and contact arrangement. In accordance with this process, two source and drain regions 101, 102 are, as depicted in FIG. 1, formed by implanting impurities into a pre-doped substrate 104. While not shown, it will be readily understood that the resulting source and drain regions which are produced by annealing the substrate in a manner to suitably diffuse the dopants in the respective implants, can be formed in either a P doped portion of the substrate or in a N-well.

Further, the dopants can be lightly doped to form extension implants which are annealed to diffuse the impurities and form the extensions; and subsequently moderately or heavily doped and subsequently activated annealed to complete the formation of the region. For simplicity, the source and drain regions are illustrated in the figures in a manner which does not show formation of the lightly doped shallow extensions.

In fact, while the disclosure is such as to focus on the formation of a single gate and a single contact, it will be understood that the technique, which forms a basis of the invention, can be applied simultaneously to the formation of multiple contacts per gate and to the formation of both p-n-p and n-on type transistors.

Figure 2:
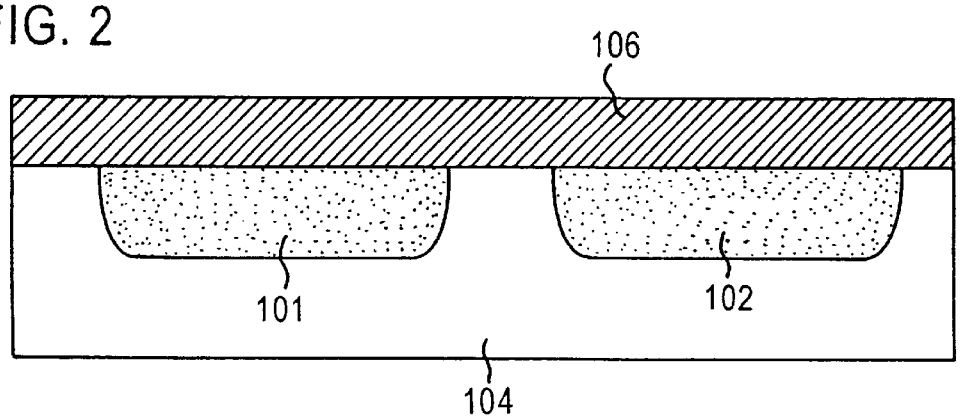
FIG. 2 shows the substrate shown in FIG. 1, covered with a thick dielectric layer formed by using either CVD, thermal oxidation, or nitridation.

Following the formation of the source and drain regions, a thick dielectric layer of $SiO_2$ 106, also known as an "interlayer dielectric" or "ILD", is deposited over the surface of the doped substrate in the manner depicted in FIG. 2. This layer 106 is between about 2000 Å and 8000 Å thick. The layer 106 can be formed using any suitable technique such as PECVD, thermal oxidation, or nitridation.

In the case of PECVD, the dielectric layer 106 can be formed of borophosphosilicate (BPSG), silicon nitride or silicon oxynitride. The deposition, merely by way of example are, in the case of the borophosphosilicate can utilize TeOS, TMO, TMB at 400° C. at 1 Watt $cm^2$; while in the case of silicon nitride, silane, DCS; in the case of the oxynitride, silane DCS, $NH_3$, $N_2O$; and in the case of thermal oxidation a temperature of 800° C. or above.

Figure 3:
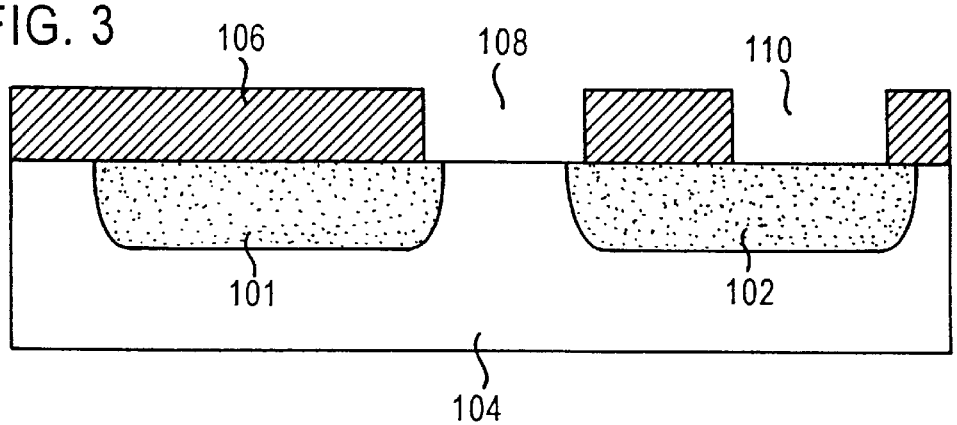
FIG. 3 shows the formation of openings in the thick dielectric layer.

The surface of the dielectric layer 106 is polished to improve its planarity. This polishing can be achieved using a suitable chemical-mechanical-polishing (CMP) technique. Next, as shown in FIG. 3, the dielectric layer is subjected to a photolithic operation in which a combination gate and contact mask is formed and the corresponding gate and contact openings 108, 110 are formed via the removal of portions of the dielectric layer using an etching technique. This can be carried out using an anisotropic RIE procedure, using a single fluorocarbon gas, or a mixture of fluorocarbon gases chosen from a group that includes $CHF_3$, $CF_4$, $C_2F_6$, $C_3F_8$, or $C_4F_8$, as an etchant, creating straight walled, anisotropic profile. Following the etching, which penetrates to and exposes the semiconductor substrate 104, the mask is stripped.

It will be noted that, for simplicity of explanation, only two openings 108. 110 are shown in the figures. The first 108 determines the location of the gate while the second 110 determines the position of the contact. In this drawing, the contact opening 110 is formed over the source region 102. However, as will be appreciated, in actual practice, openings would normally formed over both of the drain and source regions 101, 102 at this stage of the fabrication.

After the openings 108, 110 are formed in the ILD 106, a gate dielectric layer 112 is, as shown in FIG. 4, deposited on top of the ILD 106, the side walls of the openings and over the exposed portions of the semiconductor substrate at the bottom of the openings, using a suitable CVD technique. This layer can be a CVD nitride layer, an oxynitride layer or a stacked oxide-nitride-oxide (ONO) layer or alternatively a gate dielectric material such as BST and $Ta_2O_5$. The thickness of this gate dielectric layer is between about 10 Å to about 100 Å.

Next, a polysilicon layer 114 is deposited over the gate dielectric layer 112 (see FIG. 5) and doped via implantation (see FIG. 6). The layer of polysilicon is deposited using a CVD technique (for example) and is between about 500 Å and about 3000 Å thick. The doping of this layer can be carried out using phosphorus, boron or arsenic as dopants and implanted at a dosage of about $1e^{13}$ atoms $cm^{-2}$ to about 1e16 atoms $cm^{-2}$, and at an energy level of about 5 KeV to about 100 KeV. The doped layer is then annealed at a temperature between about 800° C. and 1100° C. for a period of 2 seconds to about 60 seconds.

Figure 7:
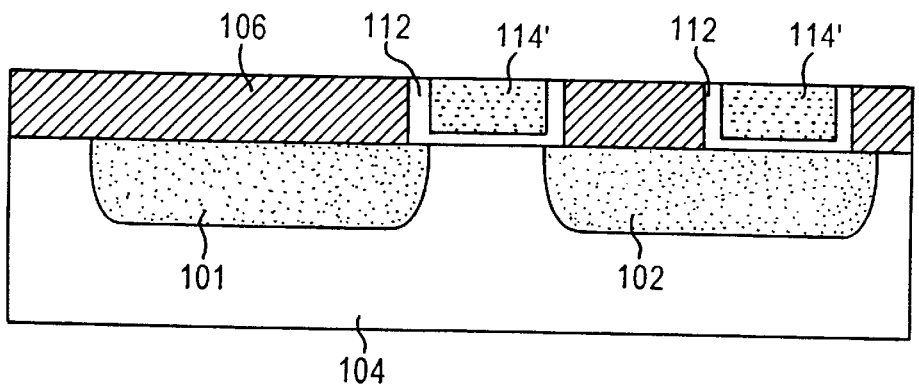
FIG. 7 shows the substrate following a CMP process which is used to remove the layers of polysilicon and oxide to a level flush with the upper surface of the thick dielectric layer.
Figure 8:
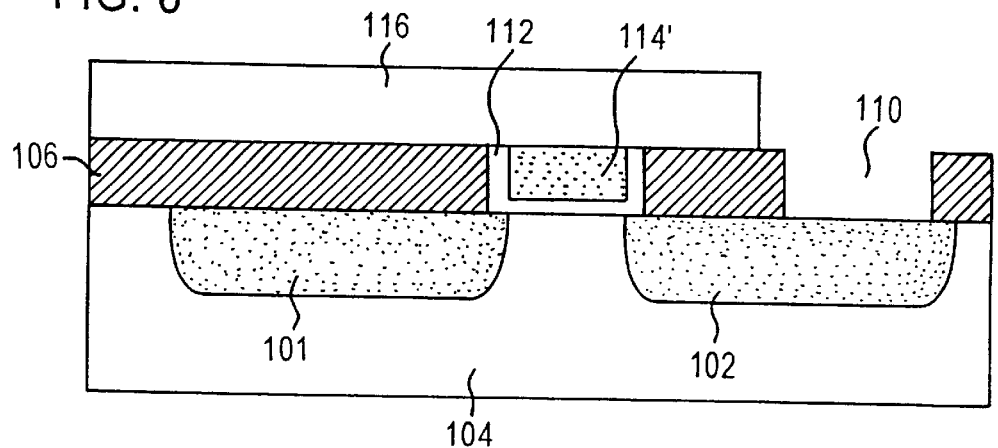
FIG. 8 shows the formation of a mask and the results of anisotropic etching which removes the polysilicon and oxide from the opening which is to form the contact.
Figure 9:
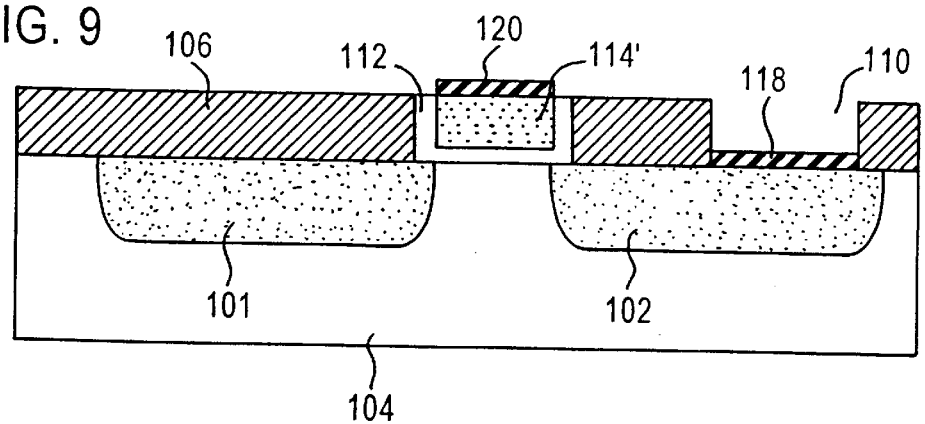
FIG. 9 shows the result of saliciding of the top of the a gate and the bottom of the opening which becomes the contact.
Figure 10:
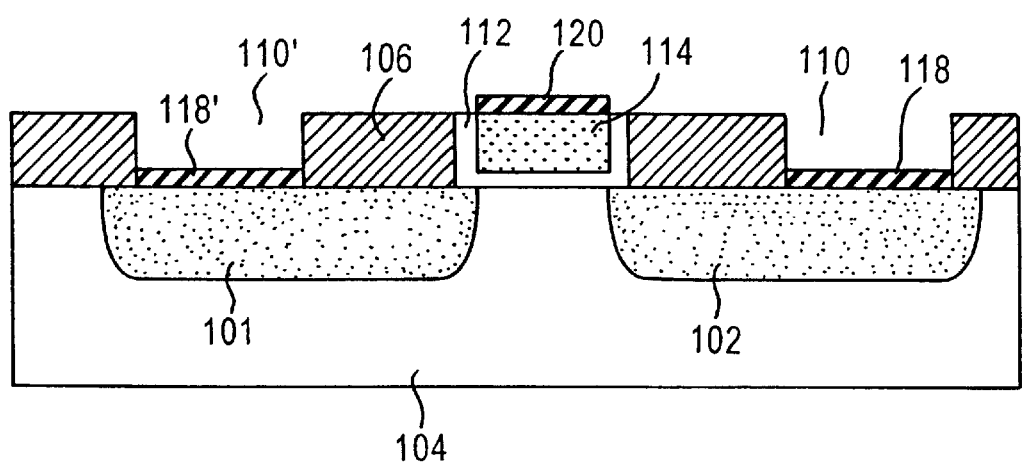
FIG. 10 shows an arrangement wherein contacts are formed over both of the source and drain regions in a manner which is within the scope of the invention.

The doped polysilicon layer 114' and the gate dielectric layer 112 are then polished using CMP or the like, down to the level of the ILD 106 to result in the structure shown in FIG. 7. Following the removal of the superfluous portion of the two layers 114', 112, the upper surface is masked with a layer of photoresist 116 to cover the gate site and to expose the contact site. The polysilicon 114' is etched out of the contact opening 110 using anisotropic He/SF$_6$ chemistry. The selectivity is usually in the 30:1 range whereby the thin gate dielectric 112 is sufficient to protect the substrate 104. After the semiconductor substrate 104 has been exposed at the bottom of the contact opening 110, the mask is removed by stripping off the layer of photo resist 116 and the upper surface of the polysilicon layer 114' exposed at the gate site and the silicon which is exposed at the bottom of the contact opening 110, are salicided using a conventional technique to form silicide layers 118, 120.

The contact can be filled per established art and CMP polished. Alternatively, the dielectric can be stripped off and redeposited, and contact formation performed using known and conventional techniques.

As pointed out above, the gate dielectric formation does not necessarily have to be carried out using CVD, and thermal oxidation with a suitable nitridation scheme can be used. Further, if the Gox (gate oxide) growth at the regions other than under the gate is essential, although the Tox (dielectric film thickness) is generally <30 Å, this is not important because masking and nitrogen implantation or NH$_3$, NO annealing can be adapted to impede oxide growth in these regions.

Of course, in this instance also, the contact can be filled using established techniques and CMP polished. Alternatively, the dielectric can be stripped off and redeposited and contact formation performed via established art.

While the present invention has been disclosed with reference to only a limited number of embodiments and examples, the versatility of the invention and the various other combinations and environments in which the invention is capable of use, will be self-evident to the person skilled in the art of semiconductor fabrication.

What is claimed is:

1. A method of forming a semiconductor device having a gate and at least one contact, the method comprising the steps of:

forming a thick dielectric layer over a semiconductor substrate in which a source region and a drain region are formed, said dielectric layer having a thickness of about 2000 Å to about 8000 Å;

forming first and second openings in the dielectric layer at first and second sites are located so that the first opening exposes part of both of the source region and the drain region, and the second opening is located so as to expose one of the source and drain regions;

forming an oxide layer over the dielectric layer and over a side wall surface and a bottom of the first and second openings;

forming a polysilicon layer over the oxide layer;

doping the polysilicon layer;

selectively removing portions of the polysilicon layer and the oxide layer until an upper surface of the dielectric layer is uncovered;

masking the first site;

removing the polysilicon and the oxide layers from the second opening to expose the semiconductor substrate at the bottom of the second opening;

removing the mask; and reacting the exposed portions of the polysilicon which remains in the first opening and the silicon at the bottom of the second opening with a metal to form first and second silicide layers.

2. A method of forming a semiconductor device as set forth in claim 1, wherein the step of forming the thick dielectric layer comprises one of CVD, thermal oxidation or nitridation.

3. A method of forming a semiconductor device as set forth in claim 1, wherein the step of forming the oxide layer over the surface of the thick dielectric layer comprises the formation of one of a nitride layer, an oxynitride layer or a stacked nitride oxide layer.

4. A method of forming a semiconductor device as set forth in claim 1, wherein the step of forming the oxide layer over the surface of the thick dielectric layer comprises the formation of an oxide layer having a thickness of about 10 Å to about 100 Å.

5. A method of forming a semiconductor device as set forth in claim 1, wherein the step of forming a polysilicon layer comprises the step of forming a polysilicon layer having a thickness of about 500 Å to about 3000 Å.

6. A method of forming a semiconductor device as set forth in claim 1, wherein the step of doping the polysilicon layer comprises the step of implanting a dopant comprising one of arsenic, boron or phosphorus which is implanted at a dosage of about 1e13 atoms cm$^{-2}$ to about 1e16 atoms cm$^{-2}$, and at an energy level of about 5 KeV to about 100 KeV.

7. A method of forming a semiconductor device as set forth in claim 1, wherein the step of selectively removing portions of the polysilicon and oxide layers comprises the step of using chemical-mechanical polishing.

* * * * *